United States Patent
Guo

(10) Patent No.: US 11,198,797 B2
(45) Date of Patent: Dec. 14, 2021

(54) CHEMICAL MECHANICAL POLISHING COMPOSITIONS HAVING STABILIZED ABRASIVE PARTICLES FOR POLISHING DIELECTRIC SUBSTRATES

(71) Applicant: Rohm and Haas Electronic Materials CMP Holdings, Inc., Newark, DE (US)

(72) Inventor: Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/749,445

(22) Filed: Jan. 22, 2020

(65) Prior Publication Data

US 2020/0239737 A1    Jul. 30, 2020

Related U.S. Application Data

(60) Provisional application No. 62/796,339, filed on Jan. 24, 2019.

(51) Int. Cl.
  *C09G 1/02*     (2006.01)
  *H01L 21/02*    (2006.01)
  *H01L 21/321*   (2006.01)

(52) U.S. Cl.
  CPC ............ *C09G 1/02* (2013.01); *H01L 21/0217* (2013.01); *H01L 21/02164* (2013.01); *H01L 21/3212* (2013.01)

(58) Field of Classification Search
  None
  See application file for complete search history.

(56) References Cited

U.S. PATENT DOCUMENTS

| | | | |
|---|---|---|---|
| 7,077,880 B2 | 7/2006 | Siddiqui | |
| 8,083,964 B2 * | 12/2011 | Yamada | C09G 1/02 216/88 |
| 9,382,450 B2 | 7/2016 | Belmont | |
| 10,851,267 B2 * | 12/2020 | Yoshizaki | H01L 21/30625 |
| 2006/0046490 A1 * | 3/2006 | Banerjee | C11D 7/20 438/692 |
| 2007/0251156 A1 | 11/2007 | Siddiqui | |
| 2008/0206995 A1 * | 8/2008 | Tomiga | H01L 21/3212 438/693 |
| 2009/0221145 A1 * | 9/2009 | Inada | C09G 1/02 438/693 |
| 2013/0109182 A1 * | 5/2013 | Guo | H01L 21/3212 438/693 |
| 2016/0222254 A1 * | 8/2016 | Huang | H01L 21/30625 |
| 2019/0375643 A1 * | 12/2019 | Li | C09K 3/1409 |
| 2020/0040256 A1 * | 2/2020 | Stender | C09K 13/06 |

* cited by examiner

*Primary Examiner* — Shamim Ahmed
(74) *Attorney, Agent, or Firm* — John j. Piskorski

(57) ABSTRACT

A chemical mechanical polishing composition for polishing dielectric substrates includes colloidal silica abrasive particles stabilized with polyalkoxylated organosilanes.

6 Claims, No Drawings

CHEMICAL MECHANICAL POLISHING COMPOSITIONS HAVING STABILIZED ABRASIVE PARTICLES FOR POLISHING DIELECTRIC SUBSTRATES

This application claims priority to U.S. Provisional Application No. 62/796,339, filed on Jan. 24, 2019, which is incorporated herein by reference in its entirety.

FIELD OF THE INVENTION

The present invention is directed to chemical mechanical polishing compositions having stabilized colloidal silica abrasive particles at alkaline pH for polishing dielectric substrates. More specifically, the present invention is directed to chemical mechanical polishing compositions having stabilized colloidal silica abrasive particles at alkaline pH, wherein the stabilized colloidal silica abrasive particles are stabilized with polyalkoxylated organosilanes.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by various deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain advanced device designs demand alkaline polishing compositions that provide enhanced interlayer dielectric (ILD) removal efficiency at lower point-of-use (POU) abrasive wt %. Such ILDs include silicon oxide and silicon nitride. One approach is to increase the electrolyte concentrations, thus increasing conductivity; however, increasing the electrolyte concentrations results in colloidal silica abrasive particle instability. Increasing ionic concentration leads to less surface charges on the colloidal silica abrasive particles and renders less particle repulsion which is the primary force stabilizing the particles.

Accordingly, there is a need for polishing compositions and polishing methods that exhibit improved stability of colloidal silica abrasive particles at alkaline pH.

SUMMARY OF THE INVENTION

The present invention is directed to a chemical mechanical polishing composition, comprising, as initial components:
water;
colloidal silica abrasive particles;
a polyalkoxy organosilane having formula (I):

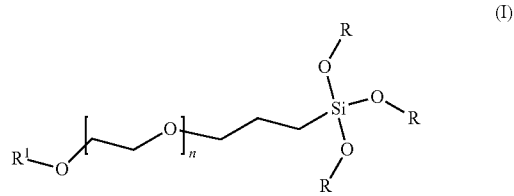

wherein R is selected from $(C_1-C_4)$alkyl; $R^1$ is selected from the group consisting of hydrogen, $(C_1-C_4)$alkyl and $R^2C(O)$—, wherein $R^2$ is selected from the group consisting of hydrogen and $(C_1-C_4)$alkyl; and n is an integer ranging from 1 to 12;
a pH>7; and
optionally an inorganic salt of an alkali metal or ammonium or mixtures thereof; and
optionally a pH adjusting agent.

The present invention also includes a method for chemical mechanical polishing of a substrate, comprising:
providing a substrate, wherein the substrate comprises at least one of silicon oxide, silicon nitride and polysilicon;
providing a chemical mechanical polishing composition, comprising, as initial components:
water;
colloidal silica abrasive particles;
a polyalkoxy organosilane having formula (I):

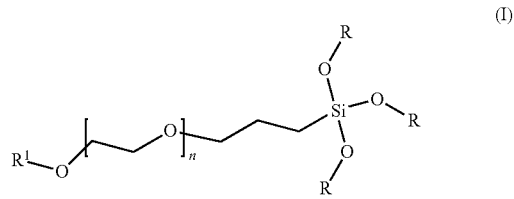

wherein R is selected from $(C_1-C_4)$alkyl; $R^1$ is selected from the group consisting of hydrogen, $(C_1-C_4)$alkyl and $R^2C(O)$—, wherein $R^2$ is selected from the group consisting of hydrogen and $(C_1-C_4)$alkyl; and n is an integer ranging from 1 to 12;
a pH>7; and
optionally an inorganic salt of an alkali metal or ammonium or mixtures thereof; and
optionally a pH adjusting agent;
providing a chemical mechanical polishing pad with a polishing surface;
creating dynamic contact at an interface between the polishing surface of the chemical mechanical polishing pad and the substrate with a down force of 0.69 to 69 kPa; and
dispensing the chemical mechanical polishing composition onto the chemical mechanical polishing pad at or near the interface between the chemical mechanical polishing pad and the substrate;

wherein the substrate is polished; and, wherein at least some of the silicon oxide, silicon nitride, polysilicon or combinations thereof is removed from the substrate.

The polyalkoxy organosilane compounds of the chemical mechanical polishing compositions of the present invention stabilize colloidal silica abrasive particles at alkaline pH, such that the colloidal silica abrasive particles do not substantially agglomerate. Such agglomeration is inhibited by the polyalkoxy organosilane compounds which covalently modify the surface of the colloidal silica abrasive particles to provide steric protection. Such steric protection is achieved even at relatively high concentrations of inorganic salts.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; kPa=kilopascal; cm=centimeter; nm=nanometers; min.=minute; mS=millisiemens; wt %=percent by weight; PS=Polishing Slurry of the Invention; PC=Comparative Polishing Slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "composition" and "slurry" are used interchangeably throughout the specification. The term "halide" means chloride, bromide, fluoride and iodide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing composition of the present invention contains water; colloidal silica abrasive particles; and a polyalkoxy organosilane compound having formula (I):

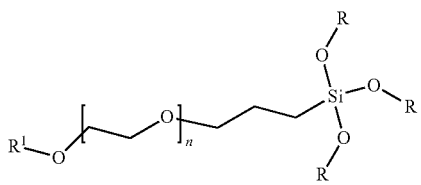

(I)

wherein R is selected from $(C_1-C_4)$alkyl, such as methyl, ethyl propyl or butyl, preferably, R is selected from $(C_1-C_3)$ alkyl, such as methyl, ethyl or propyl, more preferably R is selected from $(C_1-C_2)$alkyl, such as methyl or ethyl, most preferably, R is methyl; $R^1$ is selected from the group consisting of hydrogen and $(C_1-C_4)$alkyl, such as methyl, ethyl propyl or butyl, and $R^2C(O)$—, wherein $R^2$ is selected from the group consisting of hydrogen and $(C_1-C_4)$alkyl, such as methyl, ethyl, propyl or butyl, preferably, $R^1$ is selected from the group consisting of hydrogen, $(C_1-C_3)$ alkyl, such as methyl, ethyl or propyl, and $R^2$—C(O)—, wherein $R^2$ is selected from $(C_1-C_2)$alkyl, such as methyl or ethyl, more preferably, $R^1$ is selected from the group consisting of hydrogen, methyl and $R^2$—C(O)—, wherein $R^2$ is methyl, most preferably, $R^1$ is methyl; and n is an integer from 1 to 12, preferably, n is an integer ranging from 6-12, more preferably, n is an integer ranging from 6-9, 8-12 or 9-12, even more preferably, n is an integer ranging from 6-9 or from 9-12, most preferably, n ranges from 6-9.

Preferably in the chemical mechanical polishing compositions of the present invention the polyalkoxy organosilane compounds having formula (I) as described above include a mixture of ethoxylations, wherein the number of ethoxylations is designated by the variable n, as above, and n ranges from 6-9, 8-12 or 9-12, more preferably, n ranges from 6-9 or 9-12, most preferably, n ranges from 6-9 ethoxylations. Exemplary polyalkoxy organosilanes of the present invention are the following:

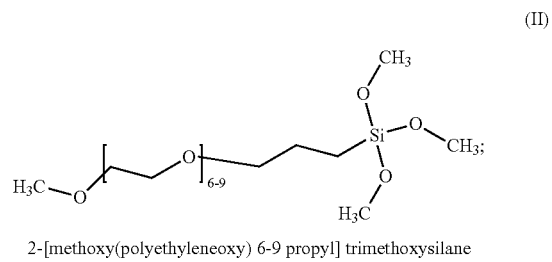

2-[methoxy(polyethyleneoxy) 6-9 propyl] trimethoxysilane

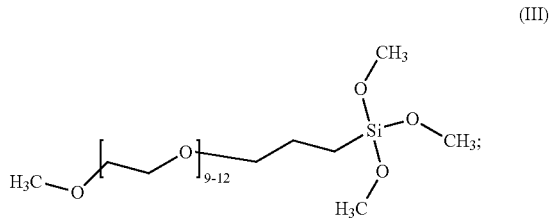

2-[methoxy(polyethyleneoxy) 9-12 propyl] trimethoxysilane

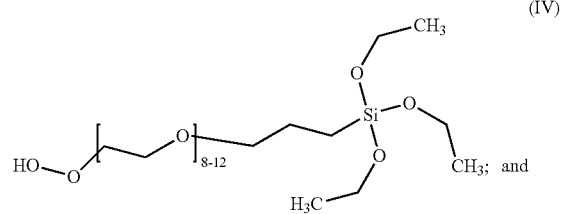

[Hydroxy(polyethyleneoxy) 8-12 propyl] triethoxysilane

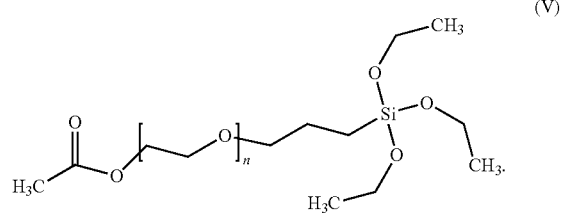

2[(acetoxy(polyethyleneoxy) propyl] triethoxysilane

The chemical mechanical polishing composition of the present invention contains, as an initial component, 0.001 to 5 wt % of a polyalkoxy organosilane having formulas (I)-(V), preferably, 0.01 to 1 wt %, more preferably, from 0.05 to 0.5 wt %, most preferably, from 0.05 to 0.25 wt %.

The chemical mechanical polishing composition of the present invention has a pH>7. Preferably, the chemical mechanical polishing composition of the present invention has a pH of 8 to 12, more preferably, the chemical mechanical polishing composition of the present invention has a pH of 8 to 11, most preferably, the chemical mechanical polishing composition of the present invention has a pH of 9 to 11.

Optionally, a pH adjusting agent can be added to the chemical mechanical polishing composition of the present invention as necessary to adjust the pH of the chemical mechanical polishing composition to >7. Such pH adjusting agents include one or more of sodium hydroxide, potassium hydroxide, ammonia and quaternary ammonium compounds.

The water contained in the chemical mechanical polishing composition is preferably at least one of deionized and distilled to limit incidental impurities.

The abrasive for use in the chemical mechanical polishing composition of the present invention is colloidal silica. Preferably, the colloidal silica abrasive contains at least one of precipitated silica. Preferably, the colloidal silica used has an average particle size of <200 nm, more preferably, 75 to 150 nm, most preferably, 100 to 150 nm; and accounts for 0.1 to 40 wt %, preferably, 5 to 25 wt %, more preferably, 8 to 25 wt %, most preferably from 15 to 25 wt % of the chemical mechanical polishing composition. Examples of commercially available colloidal silica are Klebosol™ II 1630 colloidal silica with 139 nm average particle size; Klebosol™ II 1630 colloidal silica with 145 nm average particles size; and Klebosol™ II 1730 colloidal silica with 130 nm particle size all manufactured by Merck KgAA, Darmstadt, Germany, all available from The Dow Chemical Company. Preferably, the colloidal silica abrasive particles have a negative zeta potential.

Optionally, the chemical mechanical polishing composition includes one or more inorganic salts of alkali metals and ammonium. Preferably, the amount of inorganic salt is included in the chemical mechanical polishing composition in amounts of 0.01 to 2 wt %, preferably, 0.1 to 1 wt %, more preferably from 0.25 to 1 wt %, most preferably, from 0.5 to 1 wt %, wherein alkali metals are chosen from one or more of lithium, sodium, potassium, cesium and counter-anions are chosen from one or more of nitrate, carbonate, bicarbonate, halide, phosphate, biphosphate, pyrophosphate, triphosphate and sulfate. A most preferred inorganic salt is potassium carbonate.

Optionally, the acid chemical mechanical polishing compositions can contain biocides, such as KORDEX™ MLX (9.5-9.9% methyl-4-isothiazolin-3-one, 89.1-89.5% water and <1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the acid chemical mechanical polishing compositions of the present invention in conventional amounts, as known to those of ordinary skill in the art.

Preferably, the chemical mechanical polishing composition of the present invention is free of oxidizing agents and corrosion inhibitors.

Preferably, the chemical mechanical polishing composition consists of: water; colloidal silica abrasive particles; a polyalkoxy organosilane compound having formula (I):

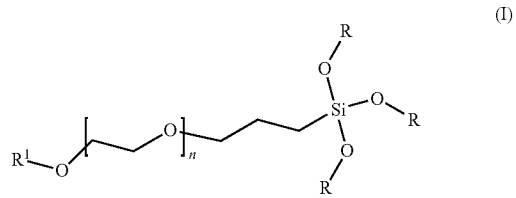

wherein R is selected from $(C_1-C_4)$alkyl; $R^1$ is selected from the group consisting of hydrogen, $(C_1-C_4)$alkyl and $R^2C(O)—$, wherein $R^2$ is selected from the group consisting of hydrogen and $(C_1-C_4)$alkyl; and n is an integer ranging from 1 to 12; a pH>7; and optionally an inorganic salt of an alkali metal or ammonium or mixtures thereof; optionally a pH adjusting agent; and optionally a biocide.

More preferably, the chemical mechanical polishing composition consists of: water; colloidal silica abrasive particles; a polyalkoxy organosilane compound having formula (I):

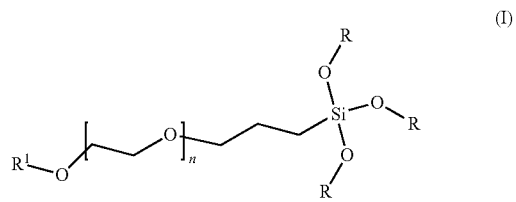

wherein R is selected from $(C_1-C_4)$alkyl; $R^1$ is selected from the group consisting of hydrogen, $(C_1-C_4)$alkyl and $R^2C(O)—$, wherein $R^2$ is selected from the group consisting of hydrogen and $(C_1-C_4)$alkyl; and n is an integer ranging from 1 to 12; a pH>7; an inorganic salt of an alkali metal or ammonium or mixtures thereof; optionally a pH adjusting agent; and optionally a biocide.

Even more preferably, the chemical mechanical polishing composition consists of: water; colloidal silica abrasive particles; a polyalkoxy organosilane compound selected from the group consisting of 2-[methoxy(polyethyleneoxy) 6-9 propyl] trimethoxysilane, 2-[methoxy(polyethyleneoxy) 9-12 propyl] trimethoxysilane, [Hydroxy(polyethyleneoxy) 8-12 propyl]triethoxysilane, and 2-[(acetoxy(polyethyleneoxy) propyl] triethoxysilane; an inorganic salt of an alkali metal or ammonium or mixtures thereof; optionally a pH adjusting agent; and optionally a biocide.

The substrate polished in the chemical mechanical polishing method of the present invention comprises at least one of silicon oxide, silicon nitride and polysilicon. The silicon oxide in the substrate includes, but is not limited to, borophosphosilicate glass (BPSG), plasma etched tetraethyl ortho silicate (PETEOS), thermal oxide, undoped silicate glass, high density plasma (HDP) oxide, and silicon dioxide derived from tetraethyl ortho silicate (TEOS). The silicon nitride of the substrate, if present, includes, but is not limited to, silicon nitride material, such as, $Si_3N_4$. Polysilicon can include amorphous polysilicon, single crystal polysilicon or crystalline polysilicon.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

The following examples are intended to further illustrate the present invention but are not intended to limit its scope.

Example 1

Chemical Mechanical Polishing Compositions

The following chemical mechanical polishing compositions were prepared to include the components and amounts disclosed in Table 1 below. The components were combined with the balance being deionized water. The pH of the compositions was adjusted with potassium hydroxide.

Example 2

Oven Aging Study and Mean Particle Size

Slurries form Table 1 in Example 1 were place in conventional convection oven at 55° C. to accelerate particle aging and the mean particle size was monitored and collected by particle size (CPS) over the course of four weeks. Particle size (CPS) means the weight average particle size of a compositions as determined by a CPS Instrument disc centrifuge system (available from CPS Instruments Inc). The particles are separated by size using centrifugal forces in a solvent and quantified using optical light scattering.

TABLE 2

| Polishing Slurry | Mean Particle Size (nm) Day 1 | Mean Particle Size (nm) Day 14 | Mean Particle Size (nm) Day 28 |
|---|---|---|---|
| PC-1 | 108 | 139 | 155 |
| PC-2 | 107 | 121 | 145 |
| PS-1 | 105 | 107 | 108 |

Mean particle size increased >35% over 28 days for the comparative slurries, even with conventional glycidoxypropyltriethoxysilane colloidal silica stabilizer. In contrast, the mean particle size of the slurry of the present invention stabilized with methoxypolyethyleneoxy-6-9 propyltrimethoxysilane which had a mean particle size increase over 28 days of only about 3%.

Example 3

Chemical Mechanical Polishing Compositions

The following chemical mechanical polishing compositions were prepared to include the components and amounts disclosed in Table 3 below. The components were combined with the balance being deionized water. The pH of the compositions was adjusted with potassium hydroxide.

TABLE 1

| Polishing Slurry | Abrasive* (wt %) | Potassium Carbonate£ (wt %) | Glycidoxypropyl-triethoxysilane (wt %) | Methoxypolyethyleneoxy-6-9 propyltrimethoxysilane (wt %) | pH |
|---|---|---|---|---|---|
| PC-1 | 24 | 1 | — | — | 10.8 |
| PC-2 | 24 | 1 | 0.25 | — | 10.8 |
| PS-1 | 24 | 1 | — | 0.25 | 10.8 |

*Abrasive: Klebosol ™ II 1630 colloidal silica with 139 nm average particle size manufactured by Merck KgAA, Darmstadt, Germany, available from The Dow Chemical Company; and
£Potassium Carbonate, 99.9 wt. % (available from Aldrich).

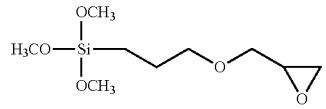

(VII)
Glycidoxypropyl-triethoxysilane

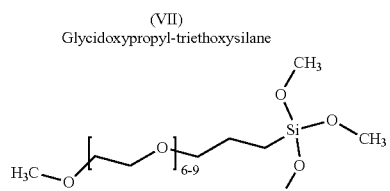

(II)
Methoxypolyethyleneoxy-6-9 propyltrimethoxysilane

TABLE 3

| Polishing Slurry | Abrasive* (wt %) | Potassium Carbonate (wt %) | Methoxypolyethyleneoxy-6-9 propyltrimethoxysilane (wt %) | pH |
|---|---|---|---|---|
| PC-3 | 24 | — | — | 10.8 |
| PC-4 | 24 | 0.5 | — | 10.8 |
| PC-5 | 24 | 1 | — | 10.8 |
| PC-6 | 24 | 1.5 | — | 10.8 |
| PS-2 | 24 | 1 | 0.5 | 10.8 |
| PS-3 | 24 | 1 | 0.25 | 10.8 |

*Abrasive: Klebosol™ II 1630 colloidal silica with 139 nm average particle size manufactured by Merck KgAA, Darmstadt, Germany, available from The Dow Chemical Company.

Conductivity measurement procedure and apparatus:
Instrument: YSI 3200 benchtop meter available from Cole Parmer;
Probe-YSI 3253 dual platinum ring with temperature compensation;
Calibration—performed before use and used with Mettler Toledo conductivity standard available from Mettler Toledo;
Sample preparation-all samples were placed in a 25° C. water bath for 20 min. before measurements.

The results of the conductivity measurements are disclosed in Table 4 below.

TABLE 4

| Polishing Slurry | Conductivity (mS) |
|---|---|
| PC-3 | 6.10 |
| PC-4 | 13.24 |
| PC-5 | 20.29 |
| PC-6 | 27.38 |
| PS-2 | 20.36 |
| PS-3 | 20.59 |

The addition of the inorganic salt potassium carbonate increased the conductivity (ionic strength) substantially with increasing concentration, thus rendering less interparticle repulsion.

What is claimed is:

1. A chemical mechanical polishing composition, consisting of, as initial components:
water;
a colloidal silica abrasive;
a polyalkoxy organosilane having formula (I):

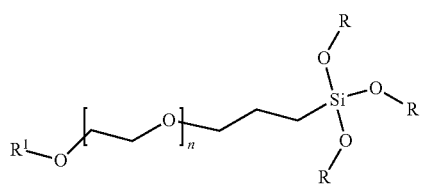

wherein R is selected from $(C_1-C_4)$alkyl; $R^1$ is selected from the group consisting of hydrogen, $(C_1-C_4)$alkyl and $R^2C(O)$—, wherein $R^2$ is selected from the group consisting of hydrogen and $(C_1-C_4)$alkyl; and n is an integer ranging from 1 to 12;
a pH>7; and
optionally an inorganic salt of an alkali metal or ammonium or mixtures thereof; and
optionally a pH adjusting agent; and optionally a biocide.

2. The chemical mechanical polishing composition of claim 1, wherein the chemical mechanical polishing composition consists of, as initial components:
water;
0.1 to 40 wt % of the colloidal silica abrasive particles;
0.001 to 5 wt % of the polyalkoxy organosilane having formula (I);
0.01 to 2 wt % of an inorganic salt of an alkali metal or ammonium or mixtures thereof;
a pH adjusting agent; and,
the pH is from 8-12.

3. The chemical mechanical polishing composition of claim 1, wherein the chemical mechanical polishing composition consists of, as initial components:
water;
the colloidal silica abrasive particles;
the polyalkoxy organosilane having formula (I), wherein R is selected from the group consisting of methyl, ethyl and propyl, $R^1$ is selected from the group consisting of hydrogen, methyl, ethyl, propyl and $R^2$—C(O)—, wherein $R^2$ is selected from the group consisting of hydrogen, methyl, ethyl and propyl; and further comprising an inorganic salt of an alkali metal or ammonium or mixtures thereof; n is an integer ranging from 6-12; a pH adjusting agent; and a pH from 8-12.

4. The chemical mechanical polishing composition of claim 1, wherein the chemical mechanical polishing composition consists of, as initial components:
water;
the colloidal silica abrasive particles;
the polyalkoxy organosilane having formula (I), wherein R is selected from the group consisting of methyl and ethyl, $R^1$ is selected from the group consisting of hydrogen, methyl, ethyl and $R^2$—C(O)—, wherein $R^2$ is selected from the group consisting of methyl and ethyl; and further comprising an inorganic salt of an alkali metal, wherein the inorganic salt of an alkali metal is potassium carbonate; n ranges from 6-9, 8-12 or 9-12; a pH adjusting agent; and a pH from 8-11.

5. The chemical mechanical polishing composition of claim 1, wherein the polyalkoxy organosilane having formula (I) is selected from the group consisting of 2-[methoxy (polyethyleneoxy) 6-9 propyl] trimethoxysilane, 2-[methoxy(polyethyleneoxy) 9-12 propyl] trimethoxysilane, [Hydroxy(polyethyleneoxy) 8-12 propyl]triethoxysilane, and 2-[(acetoxy(polyethyleneoxy) propyl] triethoxysilane.

6. A method for chemical mechanical polishing of a substrate, comprising:
providing a substrate, wherein the substrate comprises at least one of silicon oxide, silicon nitride and polysilicon;
providing a chemical mechanical polishing composition according to claim 1;
providing a chemical mechanical polishing pad with a polishing surface;
creating dynamic contact at an interface between the polishing surface of the chemical mechanical polishing pad and the substrate with a down force of 0.69 to 69 kPa; and
dispensing the chemical mechanical polishing composition onto the chemical mechanical polishing pad at or near the interface between the chemical mechanical polishing pad and the substrate;

wherein the substrate is polished; and, wherein at least some of the silicon oxide, silicon nitride, polysilicon or combinations thereof is removed from the substrate.

\* \* \* \* \*